United States Patent
Lehtola

(10) Patent No.: US 12,506,450 B2
(45) Date of Patent: Dec. 23, 2025

(54) POWER AMPLIFIER BIAS CIRCUIT

(71) Applicant: SKYWORKS SOLUTIONS, INC., Irvine, CA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 602 days.

(21) Appl. No.: 17/955,989

(22) Filed: Sep. 29, 2022

(65) Prior Publication Data

US 2023/0095390 A1 Mar. 30, 2023

Related U.S. Application Data

(60) Provisional application No. 63/249,884, filed on Sep. 29, 2021.

(51) Int. Cl.
*H03F 3/21* (2006.01)
*H03F 1/30* (2006.01)
*H03F 3/19* (2006.01)

(52) U.S. Cl.
CPC .............. *H03F 3/21* (2013.01); *H03F 1/302* (2013.01); *H03F 3/19* (2013.01); *H03F 2200/21* (2013.01); *H03F 2200/411* (2013.01); *H03F 2200/451* (2013.01)

(58) Field of Classification Search
CPC ...... H03F 3/21; H03F 1/302; H03F 2200/451; H03F 3/19; H03F 2200/21; H03F 1/3205; H03F 2200/411

USPC ......................................................... 330/250
See application file for complete search history.

(56) References Cited

U.S. PATENT DOCUMENTS

| | | | | |
|---|---|---|---|---|
| 7,345,547 B2 * | 3/2008 | Wang | ....................... | H03F 3/605 |
| | | | | 330/296 |
| 2014/0375390 A1 * | 12/2014 | Schooley | ................ | H03F 3/191 |
| | | | | 330/296 |
| 2020/0136559 A1 * | 4/2020 | Shimamoto | ............. | H03F 3/191 |
| 2020/0186101 A1 * | 6/2020 | Chen | ....................... | H03F 3/211 |
| 2022/0173702 A1 * | 6/2022 | Kondo | .................... | H03F 3/245 |

FOREIGN PATENT DOCUMENTS

| CN | 101043202 A | * | 9/2007 | ............. H03F 3/189 |
|---|---|---|---|---|
| CN | 110611489 A | * | 12/2019 | ............... H03F 1/02 |

OTHER PUBLICATIONS

Kim et al., An InGaP—GaAs HBT MMIC Smart Power Amplifier for W-CDMA Mobile Handsets, IEEE Journal of Solid-State Circuits, vol. 38 (Year: 2003).*

* cited by examiner

*Primary Examiner* — Andrea Lindgren Baltzell
*Assistant Examiner* — Lance Torbjorn Bartol
(74) *Attorney, Agent, or Firm* — Chang & Hale LLP

(57) ABSTRACT

A power amplifier comprises a first transistor, a second transistor, a first emitter follower, a first bias resistor, and coupling circuitry configured to couple the first bias resistor to a base of the first transistor, the first bias resistor, the second bias resistor, and an emitter of the first emitter follower at a first node, and a base of the first emitter follower to the second transistor.

20 Claims, 6 Drawing Sheets

POWER AMPLIFIER BIAS CIRCUIT

CROSS-REFERENCE TO RELATED APPLICATION

This application claims priority to U.S. Provisional Application No. 63/249,884 filed Sep. 29, 2021, entitled POWER AMPLIFIER BIAS CIRCUIT, the disclosure of which is hereby expressly incorporated by reference herein in its respective entirety.

BACKGROUND

Some embodiments of the present disclosure relate to power amplifiers and/or biasing circuits of power amplifiers.

Achieving a linear gain and/or phase characteristic while maintaining output power and/or efficiency is a key challenge in power amplifier design. An ideal power amplifier may have a linear gain amplitude-to-amplitude modulation (AM/AM; e.g., change in output amplitude when the input amplitude is changed) and/or amplitude-to-phase modulation (AM/PM; e.g., change in output phase when the input amplitude is changed) characteristic versus output power (e.g., gain slope may be equal to 0 dB/dB and/or phase slope may be equal to 0 deg/dB).

Ideally, a power amplifier may output a larger version of a signal received at an input of the power amplifier. Increasing an output signal may be achieved when a device has high gain (e.g., ratio of output signal to input signal), flat AM/AM, and/or flat AM/PM.

SUMMARY

Some implementations of the present disclosure relate to a power amplifier including: a first transistor; a second transistor; a first emitter follower; a first bias resistor; and coupling circuitry configured to couple the first bias resistor to a base of the first transistor, the first bias resistor to an emitter of the first emitter follower at a first node, and a base of the first emitter follower to the second transistor.

In some aspects, the techniques described herein relate to a power amplifier wherein the coupling circuitry is further configured to couple the base of the first emitter follower to a source of the second transistor.

In some aspects, the techniques described herein relate to a power amplifier wherein the first transistor is a bipolar junction transistor (BJT), the first emitter follower is a BJT, and the second transistor is a field-effect transistor (FET).

In some aspects, the techniques described herein relate to a power amplifier further including a third transistor.

In some aspects, the techniques described herein relate to a power amplifier wherein the coupling circuitry is further configured to couple a base of the third transistor to a source of the second transistor.

In some aspects, the techniques described herein relate to a power amplifier wherein the third transistor is a BJT.

In some aspects, the techniques described herein relate to a power amplifier wherein the third transistor is an FET.

In some aspects, the techniques described herein relate to a power amplifier further including a first reference resistor coupled between the third transistor and the second transistor.

In some aspects, the techniques described herein relate to a power amplifier further including a first diode coupled between the third transistor and the second transistor.

In some aspects, the techniques described herein relate to a power amplifier further including a first diode coupled to a source of the third transistor.

In some aspects, the techniques described herein relate to a power amplifier further including a fourth transistor.

In some aspects, the techniques described herein relate to a power amplifier wherein the coupling circuitry is further configured to couple a drain of the third transistor to a drain of the fourth transistor.

In some aspects, the techniques described herein relate to a power amplifier further including a first diode coupled to a source of the third transistor and a second diode coupled to a source of the fourth transistor.

In some aspects, the techniques described herein relate to a power amplifier further including a second emitter follower.

In some aspects, the techniques described herein relate to a power amplifier wherein the coupling circuitry is further configured to couple a base of the second emitter follower to a source of the third transistor.

In some aspects, the techniques described herein relate to a power amplifier further including a second bias resistor coupled to an emitter of the second emitter follower.

In some aspects, the techniques described herein relate to a circuit including: a first transistor; a second transistor; a third transistor; a first emitter follower; and coupling circuitry configured to couple a base of the first emitter follower to the second transistor.

In some aspects, the techniques described herein relate to a circuit further including a first bias resistor.

In some aspects, the techniques described herein relate to a circuit wherein the coupling circuitry is further configured to couple the first bias resistor to a base of the first transistor.

In some aspects, the techniques described herein relate to a circuit wherein the coupling circuitry is further configured to couple the first bias resistor to an emitter of the first emitter follower.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DESCRIPTION

Figure 1:
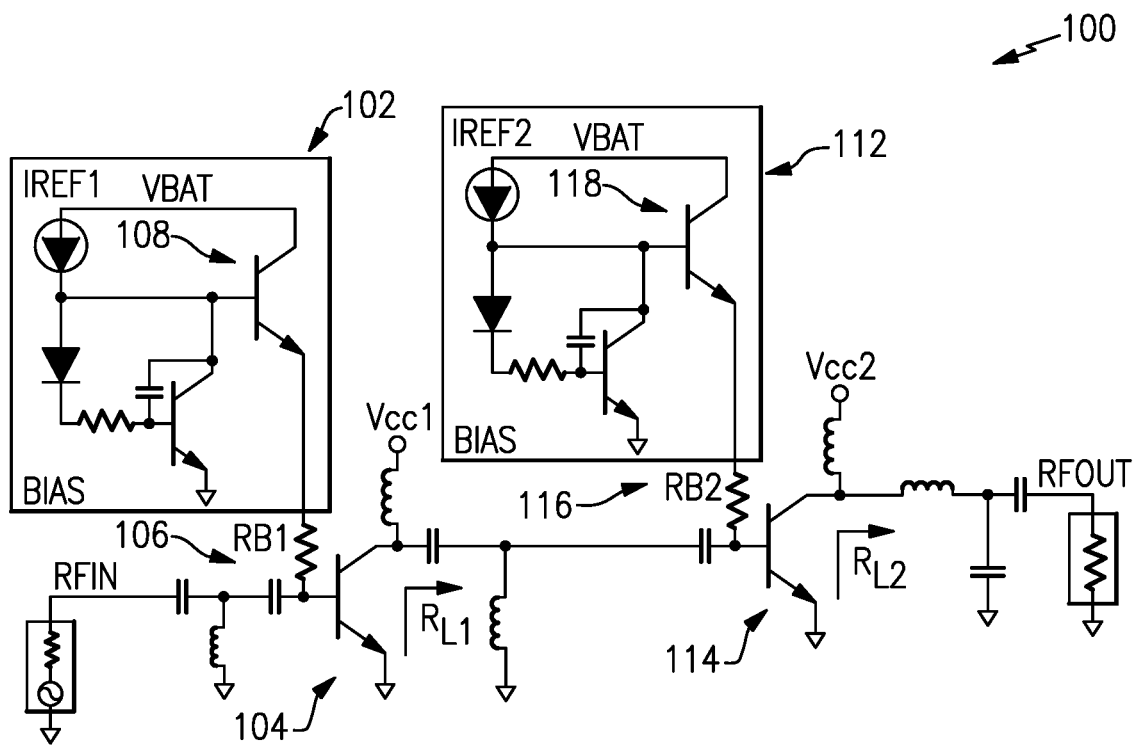
FIG. 1 illustrates a power amplifier comprising two stages, with each of the two stages having a bias circuit in accordance with some embodiments.

The headings provided herein, if any, are for convenience only and do not necessarily affect the scope or meaning of the claimed invention.

Achieving a linear gain and/or phase characteristic while maintaining output power and/or efficiency is a key challenge in power amplifier design. An ideal power amplifier may have a linear gain amplitude-to-amplitude modulation (AM/AM; e.g., change in output amplitude when the input amplitude is changed) and/or amplitude-to-phase modulation (AM/PM; e.g., change in output phase when the input amplitude is changed) characteristic versus output power (e.g., gain slope may be equal to 0 dB/dB and/or phase slope may be equal to 0 deg/dB).

Ideally, a power amplifier may output a larger version of a signal received at an input of the power amplifier. Increasing an output signal may be achieved when a device has high gain (e.g., ratio of output signal to input signal), flat AM/AM, and/or flat AM/PM.

AM/AM may be adjusted by adjusting feedback, static baseband impedance presented by the bias network, quiescent point, predistortion, and/or load lines. In some cases, a fixed bias impedance may be implemented for each stage of a power amplifier. This may be optimized during development with die variants and/or laser trimmable resistors.

In some cases, the bias impedance of a power amplifier may be optimized in various power modes with switches. However, optimizing bias impedance in this way can result in an inconsistent current mirror ratio in each state, leading to more variation over process and extreme conditions.

Some embodiments described herein may involve providing multiple bias impedance states while preserving a current mirror ratio of a bias circuit. The mirror ratio may be preserved for various control modes (e.g., a medium and/or low-power mode) by mirroring relatively larger bias resistors of the power amplifier to the reference side. A diode and/or switch may be configured to prevent a resistor from loading the bias circuit when the power amplifier is in an "OFF" state. The switch (e.g., a field-effect transistor (FET)) for each bias mode may be placed so as not to introduce any offset to the reference voltage due to a finite "ON" resistance of the switch. In some embodiments, AM/AM may be adjusted in each mode by adjusting one or more linearization capacitors of the bias circuit.

Power amplifiers can operate in different power modes, which can range from minimum power levels (e.g., −10 dBm) to maximum power levels (e.g., 30 dBm). Different power modes can adjust the bias impedance of the power amplifier depending on the current power level of the power amplifier. For example, a high-power mode can be activated for power levels between 20-30 dBm, a medium-power mode can be activated for power levels between 10-20 dBm, and/or a low-power mode can be activated for power levels below 10 dBm. In a bias network and/or bias circuit of a power amplifier, bias impedance can be increased as power level decreases to optimize linearity (e.g., AM/AM) and/or reduce current consumption. For example, low bias impedance may be used in a high-power mode to support a high base current to reach a high-power level.

Each power mode of a power amplifier may have certain tradeoffs. To minimize process variation, each component (e.g., bias resistor) of a power amplifier may be mirrored to another component. For example, to achieve a 100-1 mirror ratio, an output device may be sized 100× larger than a reference device of the power amplifier. Any deviation can result in process variation, which can have a greatly detrimental impact particular when many devices are manufactured using a single design.

FIG. 1 illustrates a power amplifier 100 comprising two stages, with each of the two stages having a bias circuit in accordance with some embodiments. The power amplifier 100 may include a first bias circuit 102 associated with and/or coupled to (e.g., via coupling circuitry) a first transistor 104. The power amplifier 100 may further comprise a second bias circuit 112 associated with and/or coupled to a second transistor 114. The first bias circuit 102 may comprise a third transistor 108 (e.g., an emitter-follower) and/or the second bias circuit 112 may comprise a fourth transistor 118 (e.g., an emitter-follower). The first bias circuit 102 may be coupled to the first transistor 104 (e.g., to a base of the first transistor 104) via a first resistor 106. For example, the first resistor 106 may be coupled between an emitter of the third transistor 108 and a base of the first transistor 104. The second bias circuit 112 may be coupled to the second transistor 114 (e.g., to a base of the second transistor 114) via a second resistor 116. For example, the second resistor 116 may be coupled between an emitter of the fourth transistor 118 and a base of the second transistor 114. Input resistance at the third transistor may be $1/g_m$.

Bias impedance can impact the AM/AM of the power amplifier 100. A 2 $V_{BE}$ bias may typically be used for linear power amplifiers. Bias impedance of the first transistor 104 and/or second transistor 114 can be set by a sum of the base resistance and output impedance of the transistor. The output impedance of the first transistor 104 and/or second transistor 114 may be equal to $1/g_m$. The first transistor 104 and/or second transistor 114 may have a resistance of approximately 10Ω and/or a bias current of only a few milliamps.

For the first bias circuit 102 and/or second bias circuit 112, the bias impedance can be reduced by reducing the size of the first resistor 106 and/or second resistor 116, respectively. In some cases, a low bias impedance may correlate to voltage source bias and/or gain expansion. At low bias impedance, base voltage may be fixed with the radio frequency input (RFIN), gain may expand with radio frequency (RF) drive, and/or direct current (DC) collector current may increase with RF drive.

Similarly, bias impedance can be increased by increasing the size of the base resistance (e.g., the first resistor 106 for the first bias circuit 102 and/or the second resistor 116 for the second bias circuit 112). In some cases, a relatively high bias impedance may correlate to a current source bias and/or gain compression. At high bias impedance, base voltage may decrease with RFIN, gain may compress early, and/or DC collector current may be fixed with RF drive.

Low impedance bias may allow a bias point to increase with RFIN power. In some cases, collector current can increase to where the power amplifier 100 is voltage limited. A bias point may increase with RF drive on current-voltage (I-V) curves and/or DC current may increase with RF drive.

High impedance bias can limit output power based on current. The power amplifier 100 may become current limited before hitting voltage saturation. The bias point may be fixed with RF drive on I-V curves and/or the DC current may stay constant with RF drive.

In some embodiments, AM/AM characteristics of the power amplifier 100 may be optimized with adjustments to the second resistor 116. In some cases, the output stage may become current limited with increasing resistance of the second resistor 116.

In some embodiments, linearity of multiple stages of the power amplifier 100 can be better than linearity at a single stage by optimizing the AM/AM of the driver to cancel the AM/AM of the final stage (e.g., including the second transistor 114). Cascaded AM/AM and/or AM/PM may define the overall linearity of the power amplifier 100. In some embodiments, increasing the value of the first resistor 106 may result in gain compression while decreasing the value of the second resistor 116 may result in gain expansion. In some cases, if additional expansion is needed, the first bias circuit 102 and/or second bias circuit 112 may be converted to a linearized bias with a bypass cap on the base(s) of the third transistor 108 and/or fourth transistor 118.

Bias resistors (e.g., the first resistor 106 and/or second resistor 116) can play a big role in shaping characteristics (e.g., bias impedance and/or power) of the power amplifier 100. To maintain linearity, gain and/or phase of the power amplifier 100 may be required to change as a function of power.

When a power amplifier has high impedance bias, the power amplifier may have high gain compression. Similarly, when the power amplifier has high impedance bias, the power amplifier may have high gain expansion. Between high impedance and low impedance may be an impedance value providing generally flat compression/expansion.

Figure 2:
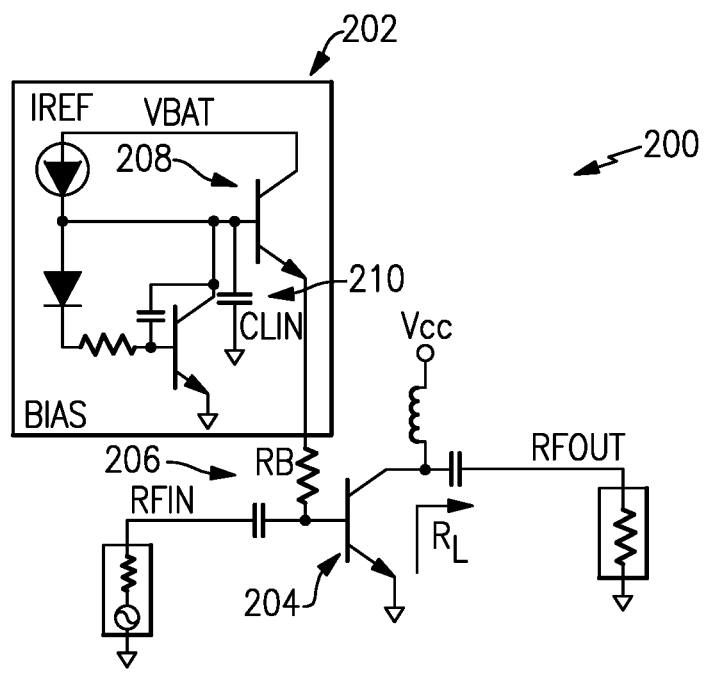
FIG. 2 illustrates another example power amplifier including a bias circuit 202 comprising a linearizer bias capacitor coupled to a base of an emitter follower 208 in accordance with one or more embodiments.

FIG. 2 illustrates another example power amplifier 200 including a bias circuit 202 comprising a linearizer bias capacitor 210 coupled to a base of an emitter follower 208 in accordance with one or more embodiments. The linearizer bias capacitor 210 may result in significantly higher base-emitter voltage on the power amplifier 200 and/or at the base of a first transistor 204 at high input driver and/or may translate to significantly more gain expansion. In some cases, the power amplifier 200 may be configured to provide beta compensated bias with only one bias impedance, which may be optimal for maximum output power and/or may restrict mode switching. A source of the emitter follower 208 may be coupled to a bias resistor 206. The bias resistor 206 may be coupled (e.g., via coupling circuitry) to a base of the first transistor 204.

Figure 3:
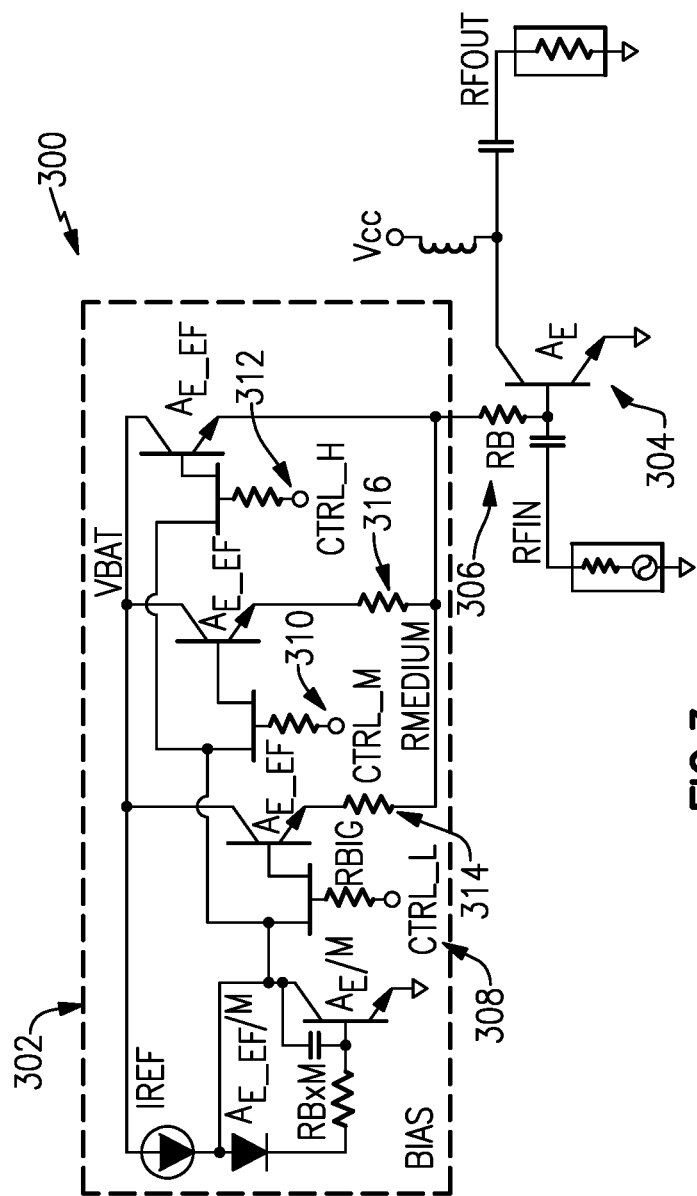
FIG. 3 illustrates an example power amplifier having three modes in accordance with one or more embodiments.

FIG. 3 illustrates an example power amplifier 300 having three modes in accordance with one or more embodiments. The power amplifier 300 may be configured to operate in different modes by selectively switching between the three modes to adjust bias impedance of the power amplifier 300. A high-power mode 312 (CTRL_H) may result in relatively high power and/or relatively low bias impedance for the power amplifier 300. A medium-power mode 310 (CTRL_M) may result in a medium-power and/or higher bias impedance than the first mode for the power amplifier 300. A low-power mode 308 (CTRL_L) may result in relatively low-power and/or a highest bias impedance (i.e., higher than the medium-power mode) for the power amplifier 300. However, mirror ratio of the power amplifier 300 may be correct only in the high-power mode.

The power amplifier 300 may comprise a reference resistor (RB×M) that may be referenced to a bias resistor 306 of the power amplifier 300. In such cases, the mirror ratio of the power amplifier 300 may be perfect when the high-power mode 312 in an "ON" state. The medium-power mode 310 and/or low-power mode 308 may have associated resistors. For example, the medium-power mode 310 may be associated with a first resistor 316 coupled to an emitter of a medium-power mode 310 transistor and/or the low-power mode 308 may be associated with a second resistor 314 coupled to an emitter of a low-power mode 308 transistor. In the power amplifier, the first resistor 316 and/or second resistor 314 may not be compensated on the reference side of the current mirror. As a result, a mirror ratio may not be constant when the medium-power mode 310 and/or low-power mode 308 is in an "ON" state.

Figure 4:
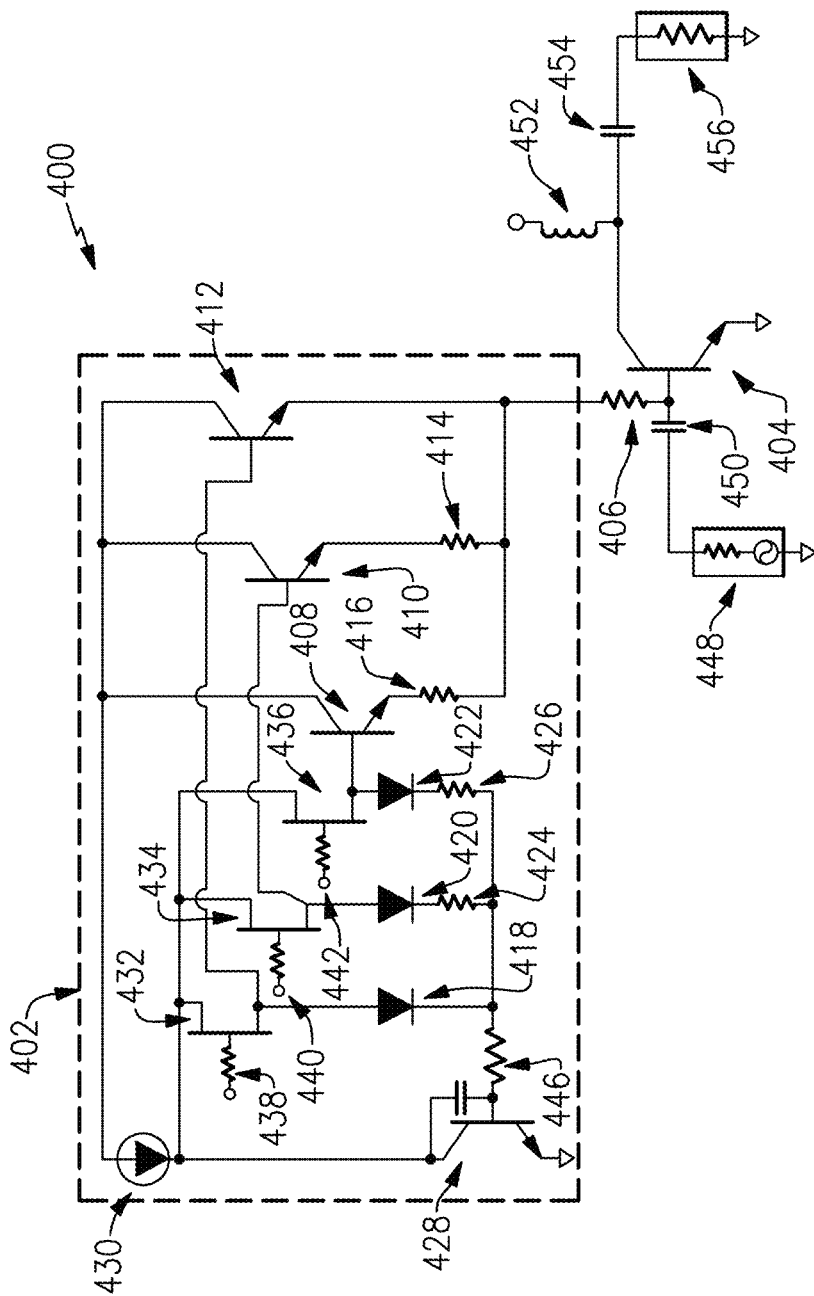
FIG. 4 illustrates a power amplifier configured to provide a constant mirror ratio in accordance with one or more embodiments.

FIG. 4 illustrates a power amplifier 400 configured to provide a constant mirror ratio in accordance with one or more embodiments. The power amplifier 400 may be configured to selectively operate in three different modes: a high-power mode 438 (CTRL_H) configured to provide a lowest bias impedance, a medium-power mode 440 (CTRL_M) configured to provide a medium bias impedance (e.g., higher than the bias impedance of the high-power mode), and/or a low-power mode 442 (CTRL_L) configured to provide a highest bias impedance. The mirror ratio of the power amplifier 400 may be constant in each power mode. Bias impedance of the power amplifier 400 may be switched per mode.

The power amplifier 400 may advantageously provide individual emitter followers for each power mode. Accordingly, switching between modes may be performed in series with reference resistors. Reference current from a reference current generator 430 may be directed through one node and/or one diode of the power amplifier 400 at a time.

The power amplifier 400 may comprise a bias circuit 402 configured to manage bias impedance levels into a first transistor 404 (e.g., a bipolar junction transistor (BJT)) of the power amplifier 400. The bias circuit 402 may comprise a first emitter follower 412 (e.g., a BJT) having an emitter that is coupled (e.g., via coupling circuitry) to a bias resistor 406. The bias resistor 406 may be coupled between the first emitter follower 412 and the first transistor 404. In some embodiments, a first capacitor 450, the bias resistor 406, and a base of the first transistor 404 may be coupled together at a first node. The first capacitor 450 may be coupled between an RF input 448 (e.g., comprising an oscillator and/or a resistor) and the first node. The first transistor 404 may have an emitter coupled to ground. In some embodiments, a collector of the first transistor 404, an inductor 452, and/or a second capacitor 454 may be coupled together at a second node. The second capacitor 454 may be coupled between the second node and an RF output 456 (e.g., comprising a resistor).

The first emitter follower 412 may be associated with the high-power mode 438. For example, the high-power mode 438 may comprise a second transistor 432 (e.g., an FET) and/or a gate resistor coupled between the gate of the second transistor 432 and a voltage supply. When a voltage is supplied at the voltage supply, the second transistor 432 may be turned on. A source of the second transistor 432 may be coupled to the base of the first emitter follower 412. In some embodiments, the source of the second transistor 432, the base of the first emitter follower 412, and an anode of a first diode 418 may be coupled together at a third node.

The bias circuit 402 may further comprise a second emitter follower 410 (e.g., a BJT). The second emitter follower 410 may be associated with the medium-power mode 440. For example, the medium-power mode 440 may comprise a third transistor 434 (e.g., an FET) and/or a gate resistor coupled between the gate of the third transistor 434 and a voltage supply. When a voltage is supplied at the voltage supply, the third transistor 434 may be turned on. A source of the third transistor 434 may be coupled to the base of the second emitter follower 410. In some embodiments, the source of the third transistor 434, the base of the second emitter follower 410, and/or an anode of a second diode 420 may be coupled together at a fourth node.

The bias circuit 402 may further comprise a third emitter follower 408 (e.g., a BJT). The third emitter follower 408 may be associated with the low-power mode 442. For example, the low-power mode 442 may comprise a fourth transistor 436 (e.g., an FET) and/or a gate resistor coupled between the gate of the fourth transistor 436 and a voltage supply. When a voltage is supplied at the voltage supply, the fourth transistor 436 may be turned on. A source of the fourth transistor 436 may be coupled to the base of the third emitter follower 408. In some embodiments, the source of the fourth transistor 436, the base of the third emitter follower 408, and/or an anode of a third diode 422 may be coupled together at a fourth node.

The second emitter follower 410 may be coupled to a first resistor 414 and/or the third emitter follower 408 may be coupled to a second resistor 416. For example, the emitter of the second emitter follower 410 may be coupled to the first resistor 414 and/or an emitter of the third emitter follower 408 may be coupled to the second resistor 416. The second resistor 416 may be larger and/or may have a greater resistance than the first resistor 414 and/or the second resistor 416 may be larger and/or may have a greater resistance than the bias resistor 406. In some embodiments, the first resistor 414, the second resistor 416, the bias resistor 406, and the emitter of the first emitter follower 412 may be coupled together at a fifth node. The first resistor 414 and/or the second resistor 416 may be bias resistors.

The power amplifier 400 may comprise a first reference resistor 446, a second reference resistor 424, and/or a third reference resistor 426. The first reference resistor 446 may be referenced to the bias resistor 406, the second reference resistor 424 may be referenced to the first resistor 414, and/or the third reference resistor 426 may be referenced to the second resistor 416. Thus, the mirror ratio of the power amplifier 400 may be perfect when the high-power mode 438 in an "ON" state, when the medium-power mode 440 in an "ON" state, and/or when the low-power mode 442 in an "ON" state. Each of the bias resistor 406, the first resistor 414, and/or the second resistor 416 may have a perfect ratio to the reference side of the power amplifier 400.

The bias circuit 402 may comprise a fifth transistor 428 (e.g., a BJT). A collector of the fifth transistor 428, the drain(s) of the second transistor 432, third transistor 434, and/or the fourth transistor 436, and/or a reference current generator 430 may be coupled together at a sixth node. The reference current generator 430 and/or the collector(s) of the first emitter follower 412, the second emitter follower 410, and/or the third emitter follower 408 may be coupled together.

A base of the fifth transistor 428 may be coupled to the first reference resistor 446. A cathode of the second diode 420 may be coupled to the second reference resistor 424. A cathode of the third diode 422 may be coupled to the third reference resistor 426. The first reference resistor 446, a cathode of the first diode 418, the second reference resistor 424, and/or the third reference resistor 426 may be coupled together at a seventh node.

The power amplifier 400 may comprise a reference device which may be configured to be thermally coupled to an array of the power amplifier. In some embodiments, additional bias impedance states may be available if multiple power modes are turned on simultaneously.

The various resistors of the power amplifier 400 may be sized to achieve a desired mirror ratio. For example, to achieve a 100-1 mirror ratio, the bias resistor 406 may be 100× larger than the first reference resistor 446, the first resistor 414 may be 100× larger than the second reference resistor 424, and/or the second resistor 416 may be 100× larger than the third reference resistor 426.

Figure 5:
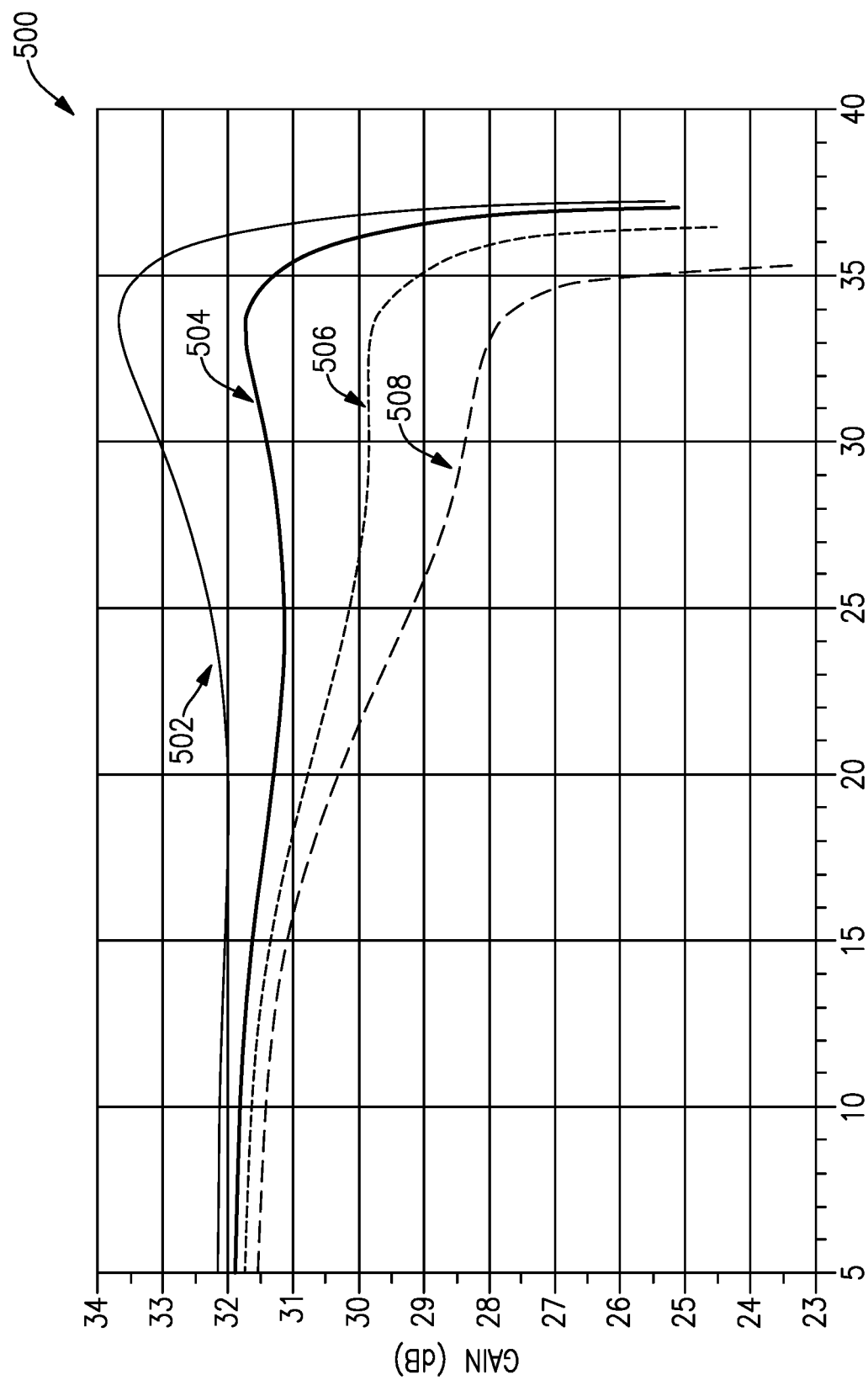
FIG. 5 provides a graph illustrating AM/AM values across increasing output power values for various power modes of an example power amplifier in accordance with one or more embodiments.

FIG. 5 provides a graph 500 illustrating AM/AM values across increasing output power values for various power modes of an example power amplifier in accordance with one or more embodiments. A first plot 502 may correspond to a first high-power mode, a second plot 504 may correspond to a second high-power mode, a third plot 506 may correspond to a medium-power mode, and/or a fourth plot 508 may correspond to a low-power mode. Additional plots between the shown plots may be formed by turning on multiple modes simultaneously. Where a power amplifier has low bias impedance (e.g., the first plot 502), the power amplifier may have high expansion. Where the power amplifier has high bias impedance (e.g., the fourth plot 508), the power amplifier may have high compression. In the between modes (e.g., the second plot 504 and/or third plot 506), the expansion and/or compression may be more linear. By switching between modes of the power amplifier, an improved linearity can be achieved.

Figure 6:
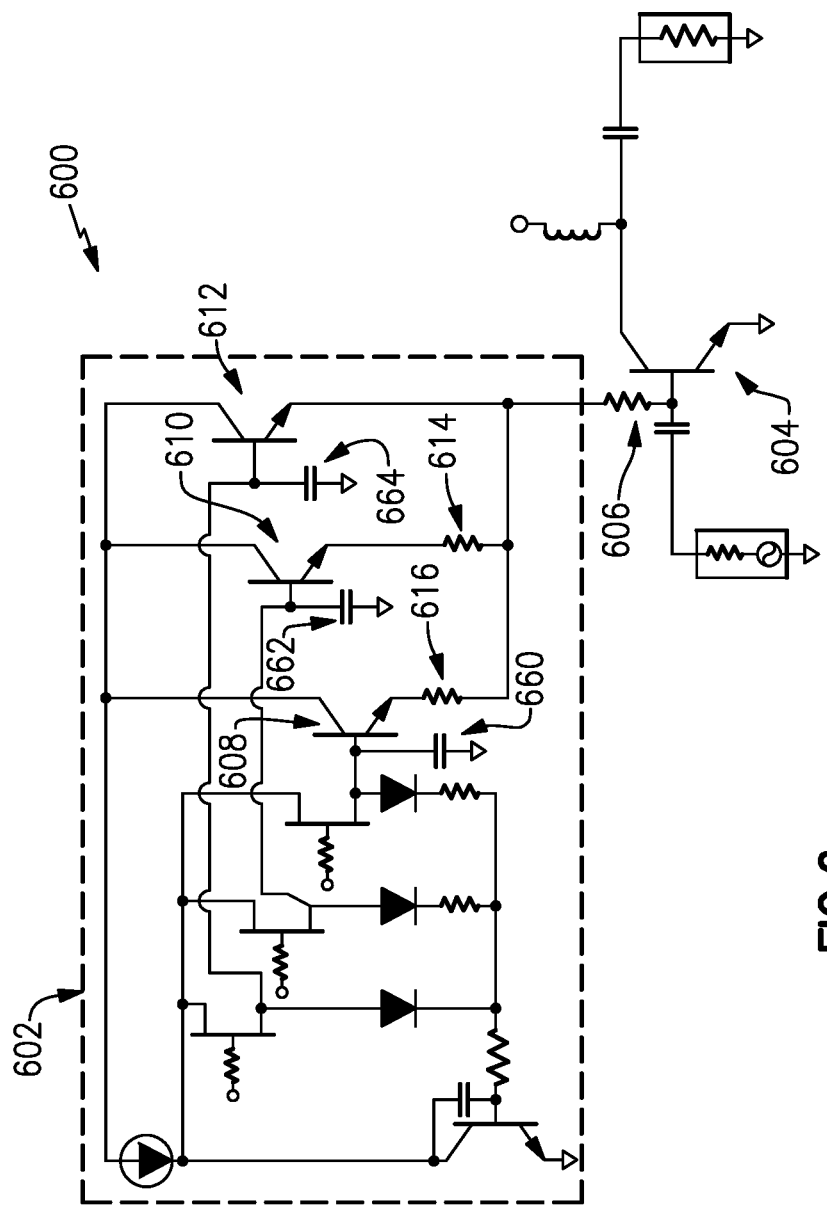
FIG. 6 illustrates a circuit for an example power amplifier comprising one or more linearized capacitors in accordance with one or more embodiments.

FIG. 6 illustrates a circuit for an example power amplifier 600 comprising one or more linearized capacitors in accordance with one or more embodiments. The power amplifier 600 may comprise a first emitter follower 612 (e.g., a BJT), a second emitter follower 610 (e.g., a BJT), and/or a third emitter follower 608 (e.g., a BJT). The base of the first emitter follower 612, a first linearized capacitor 664, and a source of a high-power mode transistor may be coupled together at a node. The base of the second emitter follower 610, a second linearized capacitor 662, and a source of a medium-power mode transistor may be coupled together at a node. The base of the third emitter follower 608, a third linearized capacitor 660, and a source of a low-power mode transistor may be coupled together at a node. In some embodiments, each mode of the power amplifier may comprise one linearized capacitor. The one or more linearized capacitors may have identical or different values. For example, the first linearized capacitor 664 may have a greater capacitance than the second linearized capacitor 662 and/or the second linearized capacitor 662 may have a greater capacitance than the third linearized capacitor 660. In some cases, a larger linearization capacitor may be configured to provide more AM/AM expansion and/or a smaller linearization capacitor may be configured to provide more AM/AM compression. Various components of the power amplifier 600, including a bias resistor 606, first resistor 614, second resistor 616, and/or first transistor 604 may be similar to components of the power amplifier 400 of FIG. 4.

The first linearized capacitor 664, second linearized capacitor 662, and/or third linearized capacitor 660 can be configured to modulate base-emitter junctions of the emitter followers. Capacitance values of the first linearized capacitor 664, second linearized capacitor 662, and/or third linearized capacitor 660 may be adjusted for each mode of the power amplifier 600. For example, capacitance values can be relatively high for a high-power mode and/or relatively low for a low-power mode to tune AM/AM of the power amplifier 600.

Some embodiments described herein may be configured to optimize AM/AM in each bias impedance state while preserving the current mirror ratio. Accordingly, a power amplifier may have less variation over process and/or extreme conditions in each bias impedance state.

Some embodiment power amplifiers described herein may be applicable for integration within 5th generation (5G) and/or MLS-ET devices. Some embodiments described herein may be applicable to maximum power support of 5G devices, as well as to various dispersion requirements of 5G devices. Moreover, the power amplifiers described herein may be applicable to Doherty linearization across frequency and power as part of, for example, QuadHERO, etc.

Figure 7:
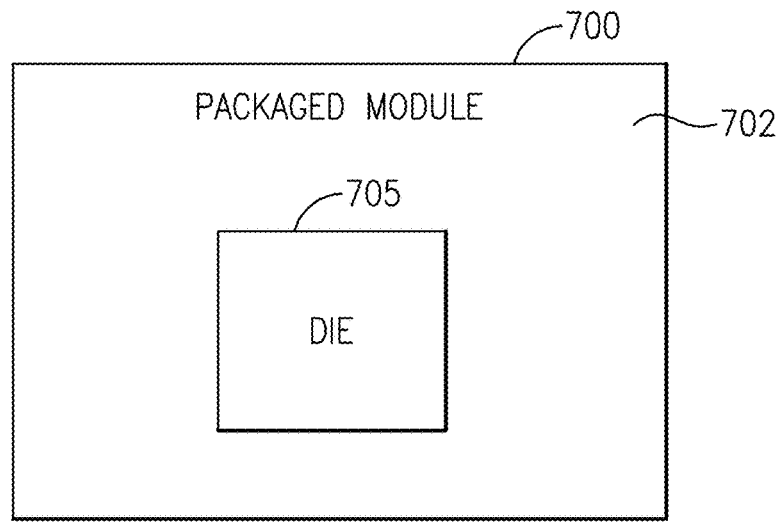
FIG. 7 shows a die implemented in a packaged module.

FIG. 7 shows a die 705 implemented in a packaged module 700. Such a packaged module can include a packaging substrate 702 configured to receive a plurality of components.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart phone, a hand-held wireless device with or without phone functionality, a wireless tablet, etc.

Figure 8:
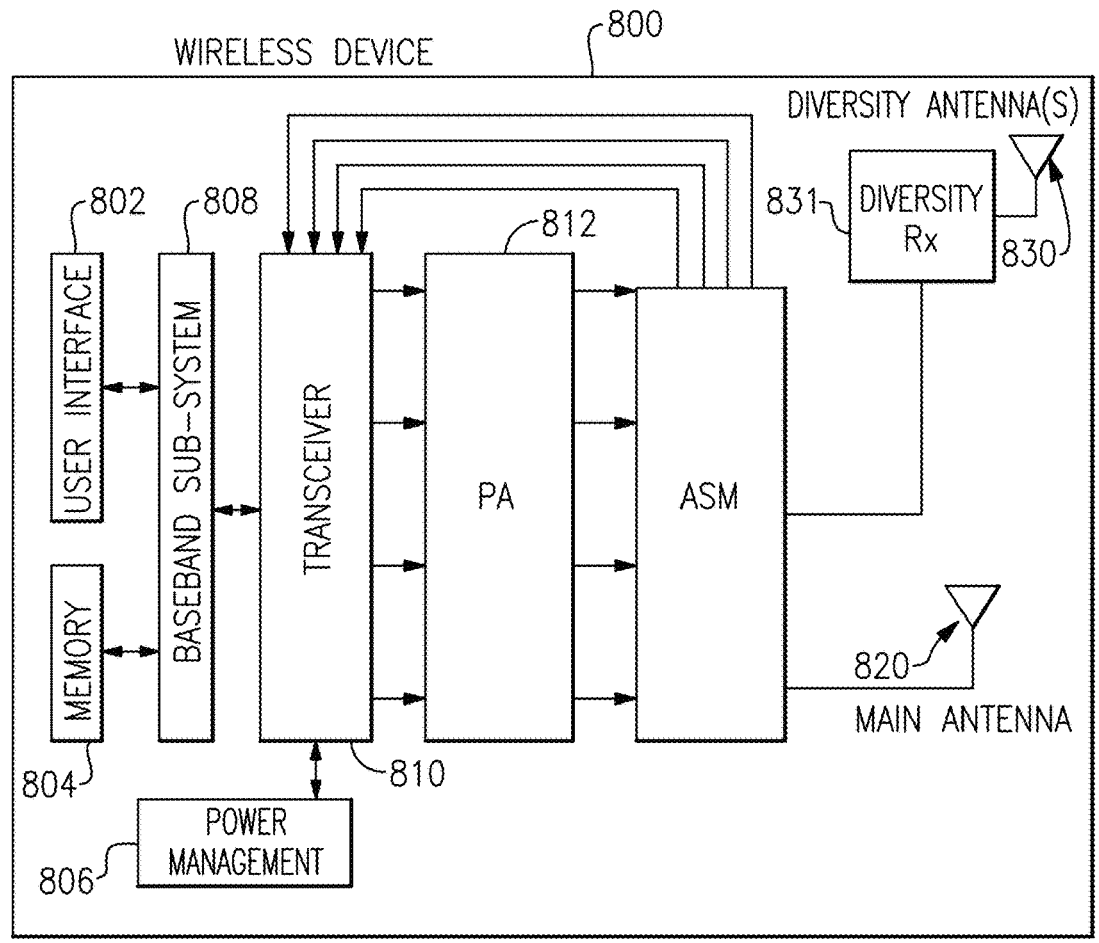
FIG. 8 depicts an example wireless device having one or more advantageous features described herein.

FIG. 8 depicts an example wireless device 800 having one or more advantageous features described herein. In some embodiments, a module that includes one or more power amplifiers can also include one or more clamps having one or more features as described herein.

In the example of FIG. 8, power amplifiers (PAs) are depicted in a PA module 812; however, it will be understood that such power amplifiers can be implemented in one or more functional blocks, one or more devices such as die or modules, etc. Such power amplifiers can receive their respective RF signals from a transceiver 810 that can be configured and operated to generate RF signals to be amplified and transmitted, and to process received signals. The transceiver 810 is shown to interact with a baseband sub-system 808 that is configured to provide conversion between data and/or voice signals suitable for a user and RF signals suitable for the transceiver 810. The transceiver 810 is also shown to be connected to a power management component 806 that is configured to manage power for the operation of the wireless device 800. Such power management can also control operations of the baseband sub-system 808 and other components of the wireless device 800.

The baseband sub-system 808 is shown to be connected to a user interface 802 to facilitate various input and output of voice and/or data provided to and received from the user. The baseband sub-system 808 can also be connected to a memory 804 that is configured to store data and/or instructions to facilitate the operation of the wireless device, and/or to provide storage of information for the user.

In the example of FIG. 8, a diversity receive (DRx) module 831 can be implemented between one or more diversity antennas (e.g., diversity antenna 830) and the front-end module. Such a configuration can allow an RF signal received through the diversity antenna 830 to be processed (in some embodiments, including amplification by an LNA) with little or no loss of and/or little or no addition of noise to the RF signal from the diversity antenna 830. Such processed signal from the DRx module 831 can then be routed to the front-end module through one or more signal paths. In some embodiments, the wireless device 800 may or may not include the foregoing DRx functionality.

In the example of FIG. 8, a plurality of antennas (e.g., 820) can be configured to, for example, facilitate transmission of RF signals from the PA module 812. In some embodiments, receive operations can also be achieved through some or all of the antennas 820.

Some implementations of the present disclosure relate to a power amplifier including: a first transistor; a second transistor; a first emitter follower; a first bias resistor; and coupling circuitry configured to couple the first bias resistor to a base of the first transistor, the first bias resistor to an emitter of the first emitter follower at a first node, and a base of the first emitter follower to the second transistor.

In some aspects, the techniques described herein relate to a power amplifier wherein the coupling circuitry is further configured to couple the base of the first emitter follower to a source of the second transistor.

In some aspects, the techniques described herein relate to a power amplifier wherein the first transistor is a bipolar junction transistor (BJT), the first emitter follower is a BJT, and the second transistor is a field-effect transistor (FET).

In some aspects, the techniques described herein relate to a power amplifier further including a third transistor.

In some aspects, the techniques described herein relate to a power amplifier wherein the coupling circuitry is further configured to couple a base of the third transistor to a source of the second transistor.

In some aspects, the techniques described herein relate to a power amplifier wherein the third transistor is a BJT.

In some aspects, the techniques described herein relate to a power amplifier wherein the third transistor is an FET.

In some aspects, the techniques described herein relate to a power amplifier further including a first reference resistor coupled between the third transistor and the second transistor.

In some aspects, the techniques described herein relate to a power amplifier further including a first diode coupled between the third transistor and the second transistor.

In some aspects, the techniques described herein relate to a power amplifier further including a first diode coupled to a source of the third transistor.

In some aspects, the techniques described herein relate to a power amplifier further including a fourth transistor.

In some aspects, the techniques described herein relate to a power amplifier wherein the coupling circuitry is further configured to couple a drain of the third transistor to a drain of the fourth transistor.

In some aspects, the techniques described herein relate to a power amplifier further including a first diode coupled to a source of the third transistor and a second diode coupled to a source of the fourth transistor.

In some aspects, the techniques described herein relate to a power amplifier further including a second emitter follower.

In some aspects, the techniques described herein relate to a power amplifier wherein the coupling circuitry is further configured to couple a base of the second emitter follower to a source of the third transistor.

In some aspects, the techniques described herein relate to a power amplifier further including a second bias resistor coupled to an emitter of the second emitter follower.

In some aspects, the techniques described herein relate to a circuit including: a first transistor; a second transistor; a third transistor; a first emitter follower; and coupling circuitry configured to couple a base of the first emitter follower to the second transistor.

In some aspects, the techniques described herein relate to a circuit further including a first bias resistor.

In some aspects, the techniques described herein relate to a circuit wherein the coupling circuitry is further configured to couple the first bias resistor to a base of the first transistor.

In some aspects, the techniques described herein relate to a circuit wherein the coupling circuitry is further configured to couple the first bias resistor to an emitter of the first emitter follower.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional subcomponents to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general-purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general-purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid-state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier comprising:
   a first transistor;
   a second transistor;
   a first emitter follower;
   a first diode;
   a first bias resistor; and
   coupling circuitry configured to couple the first bias resistor to a base of the first transistor, the first bias resistor to an emitter of the first emitter follower at a first node, and a base of the first emitter follower to an anode of the first diode and a source of the second transistor at a second node; a second emitter follower; a second diode; the coupling circuitry further configured to couple an emitter of the first emitter follower and an emitter of the second emitter follower to a base of the first transistor, the coupling circuitry further configured to couple a cathode of the first diode to a cathode of the second diode.

2. The power amplifier of claim 1 wherein the coupling circuitry is further configured to couple the base of the first emitter follower to a source of the second transistor.

3. The power amplifier of claim 1 wherein the first transistor is a bipolar junction transistor (BJT), the first emitter follower is a BJT, and the second transistor is a field-effect transistor (FET).

4. The power amplifier of claim 1 further comprising a third transistor.

5. The power amplifier of claim 4 wherein the coupling circuitry is further configured to couple a base of the third transistor to a source of the second transistor.

6. The power amplifier of claim 4 further comprising a first reference resistor coupled between the base of the third transistor and a cathode of the first diode.

7. The power amplifier of claim 4 further comprising a second diode coupled to a collector of the third transistor.

8. The power amplifier of claim 4 further comprising a fourth transistor.

9. The power amplifier of claim 8 wherein the coupling circuitry is further configured to couple a source or drain of the third transistor to a source or drain of the fourth transistor.

10. The power amplifier of claim 8 further comprising a second diode coupled to a source or drain of the fourth transistor.

11. The power amplifier of claim 4 further comprising a second emitter follower.

12. The power amplifier of claim 11 wherein the coupling circuitry is further configured to couple an emitter of the second emitter follower to the emitter of the first emitter follower.

13. The power amplifier of claim 11 further comprising a second bias resistor and a third bias resistor, wherein the emitter of the first emitter follower is directly coupled to the second bias resistor, the emitter of the second emitter follower is directly coupled to the third bias resistor, and the second bias resistor is directly coupled to the third bias resistor.

14. A circuit comprising:
   a first bipolar junction transistor (BJT);
   a first emitter follower;
   a second emitter follower;
   a first field-effect transistor (FET);
   a second FET;
   a first diode;
   a second diode; and
   coupling circuitry configured to directly couple a base of the first emitter follower to a source of the first FET and an anode of the first diode, the coupling circuitry further configured to couple an emitter of the first emitter follower and an emitter of the second emitter follower to a base of the first BJT, the coupling circuitry further configured to couple a cathode of the first diode to a cathode of the second diode.

15. The circuit of claim 14 further comprising a first bias resistor directly coupled to the emitter of the first emitter follower and a second bias resistor directly coupled to the emitter of the second emitter follower.

16. The circuit of claim 15 wherein the coupling circuitry is further configured to directly couple the first bias resistor to the second bias resistor.

17. The circuit of claim 15 wherein the first bias resistor has a greater resistance than the second bias resistor.

18. The circuit of claim 17 further comprising a first reference resistor directly coupled to the cathode of the first diode and a second reference resistor directly coupled to the cathode of the second diode.

19. The circuit of claim 18 wherein the first reference resistor is directly coupled to the second reference resistor.

20. The circuit of claim 18 wherein first reference resistor has equal resistance to the first bias resistor and the second reference resistor has equal resistance to the second bias resistor.

* * * * *